United States Patent [19]

Dumas et al.

[11] Patent Number: 4,907,645
[45] Date of Patent: Mar. 13, 1990

[54] DEVICE FOR VENTILATING RHEOSTATS AND/OR FLUID RADIATORS IN A LOCOMOTIVE

[75] Inventors: Jean-Claude Dumas, Soisy Sous Montmorency; Maurice Thoraval, Argenteuil; Gérard Genuit, Bezons, all of France

[73] Assignee: Societe Anonyme dite : ALSTHOM, Paris, France

[21] Appl. No.: 299,155

[22] Filed: Jan. 19, 1989

Related U.S. Application Data

[60] Division of Ser. No. 267,630, Oct. 31, 1988, Pat. No. 4,840,221, which is a continuation of Ser. No. 011,815, Feb. 6, 1987, abandoned.

[30] Foreign Application Priority Data

Feb. 11, 1986 [FR] France .................................. 8601847
Jan. 27, 1987 [FR] France .................................. 8700939

[51] Int. Cl.$^4$ .......................... F28F 13/12; B61C 5/00
[52] U.S. Cl. ........................................ 165/41; 165/124; 165/122; 361/384; 174/16.1; 105/59; 105/62.1
[58] Field of Search ........................ 105/62.1, 62.2, 59; 123/41, 49; 165/41, 44, 122, 124; 361/384; 174/16.1

[56] References Cited

U.S. PATENT DOCUMENTS

| 3,236,298 | 2/1966 | Laing | 165/124 |
| 3,305,164 | 2/1967 | Laing | 417/369 |

FOREIGN PATENT DOCUMENTS

| 0809026 | 2/1937 | France | 105/62.1 |
| 884217 | 3/1943 | France . | |
| 1591809 | 6/1970 | France . | |
| 0011508 | 1/1977 | Japan | 105/59 |
| 115452 | 8/1925 | Switzerland . | |
| 1789936 | 10/1935 | Switzerland | 105/62.2 |
| 256999 | 9/1948 | Switzerland . | |
| 0512513 | 4/1976 | U.S.S.R. | 105/59 |
| 0532544 | 10/1976 | U.S.S.R. | 105/62.2 |
| 0227982 | 10/1924 | United Kingdom | 105/62.1 |
| 390215 | 4/1933 | United Kingdom . | |

*Primary Examiner*—John Ford
*Attorney, Agent, or Firm*—Sughrue, Mion, Zinn, Macpeak & Seas

[57] ABSTRACT

A device for ventilating fluid radiators (5) and/or starting and braking rheostats (15) in a locomotive which is powered electrically, by means of an internal combustion engine, or by a combination thereof, said radiators and/or rheostats being disposed in a layer close to the locomotive roof (4). The device includes at least one tangential fan (8,9) having a horizontal axis which extends longitudinally relative to the locomotive and blowing air towards said radiators and/or said rheostats. The device further includes air intake openings (6,7) located in the side faces (2,3) of the locomotive.

5 Claims, 5 Drawing Sheets

DEVICE FOR VENTILATING RHEOSTATS AND/OR FLUID RADIATORS IN A LOCOMOTIVE

Division of application Ser. No. 07/267,360 filed 10-31-88, now U.S. Pat. No. 4,840,221 which is a continuation of application Ser. No. 07/011,815 filed Feb. 6, 1987 now abandoned.

The present invention relates to a device for ventilating fluid radiators and/or starting and braking rheostats in a locomotive which may be electrically powered, which may be powered by an internal combustion engine, or which may be powered by a combination thereof, said radiators and/or rheostats being disposed in a layer in the proximity of the locomotive roof.

BACKGROUND OF THE INVENTION

At present, locomotives in which power is generated by an internal combustion engine (generally a diesel engine) include one or more axial fans for ventilating radiators, i.e. cooling them by means of a flow of air, which radiators may themselves be heated either by means of a cooling fluid such as water, or else by means of the oil which is used to lubricate the engine.

Two dispositions are commonly used:

either the fluid-cooling heat exchangers are disposed vertically in layers above the locomotive chassis, in parallel with its side faces and pressed thereagainst or set back slightly therefrom; or else the heat exchangers are placed in horizontal layers in the proximity of the locomotive roof.

When using side heat exchangers, the axial fans are disposed with their axes extending vertically and the fan diffusers, or sometimes even their air-guiding shells are housed directly in openings passing through the locomotive roof. The fans then suck ambient air through the heat exchangers.

When the heat exchangers are placed in horizontal layers close to the locomotive roof, the axial fan or fans are placed beneath the layer of heat exchangers. They are generally mounted about vertical axis and blow air towards the heat exchangers, with the ducting between the fan shell and the heat exchangers flaring from a small circular cross-section at the fan end to a larger rectangular cross-section at the heat exchanger end.

In either case, it is essential to remove all obstacles from the volume close to the propeller suction zone if the ventilation is to operate properly, and where possible the suction streamlines should be guided by deflectors.

In the second variant, the vertical extent of the air duct between the fan and the heat exchangers must be sufficient to ensure that the air flow is as uniformly distributed as possible in spite of the flow beginning with a circular cross-section and subsequently cooling a rectangular area.

In either case, the installation for cooling the internal combustion engine as described above is bulky and requires not only a large amount of space for its own equipment per se, but also for suitable air passages in its immediate vicinity. In order to ensure that an axial fan operates with adequate efficiency, it is essential for the stream lines of the intake air and of the outlet air to be as near as possible parallel to the propeller axis.

It is common practice to use propellors of large diameter (e.g. 1 meter to 1.5 meters) in order to reconcile the following conditions as well as possible:

rectangular heat exchangers should be ventilated as well as possible;

maximum advantage should be taken from the greatest available width in the locomotive (while leaving adequate cross-sections for the necessary longitudinal passages); and as small as possible a number of fans should be used, in order to keep costs acceptable.

When the internal combustion engine is operating at full power, such large diameter fans frequently need to turn at 1500 to 2400 revolutions per minute (r.p.m.).

Measurements performed on stationary locomotives having diesel engines which have not been specially sound-proofed (no exhaust silencers, no silencing coating on the engine compartment walls) have shown that the noise audible outside the locomotive due to the coolingg fans is often equivalent to that due to the engine itself. Such fans are thus a major source of noise power. Further, the air intake is located close to the bottom of the locomotive in a region where the air is relatively polluted, in particular by dust and by vapor from liquid fuel.

When ventilating the starting and braking rheostats used on locomotives having electric traction drive (e.g. electric locomotives or diesel-electric locomotives), it is general practice to use a variant in which the axial fans blow air over the rheostat resistances. However the same drawbacks of noisy operation and intake or relatively polluted air re-occur.

The aim of the present invention is to provide devices for ventilating the fluid radiators associated with an internal combustion engine in a locomotive, and/or the starting and braking rheostats associated with a locomotive having electric traction, while generating less noise than current devices, while occupying less volume and while providing the same cooling efficiency.

SUMMARY OF THE INVENTION

The present invention provides a device for ventilating fluid radiators and/or starting and braking rheostats in a locomotive which may be powered electrically, by means of an internal combustion engine, or by a combination thereof, said radiators and/or rheostats requiring ventilation being disposed in a layer in the proximity of the locomotive roof, said ventilation system comprising at least one tangential fan having a horizontal axis placed longitudinally relative to the locomotive and blowing air towards the said radiators and/or rheostats, with air intake openings being placed in the side faces of the locomotive.

It preferably also includes at least one of the following features:

the tangential fan is disposed slightly below said radiators and/or rheostats, and wherein said air intake openings are placed near the tops of the side walls;

said rheostats are disposed above said radiators and beneath the locomotive roof;

the air intake openings and said radiators and/or said rheostats are placed relative to the tangential fan in such a manner that the air is sucked along a substantially horizontal path towards the fan and is blown in a substantially vertical path therefrom towards said radiators and/or rheostats;

for ventilating the rheostats of an electric locomotive or of a combined an internal combustion engine and electric locomotive, said rheostats are disposed in vertical layers beneath the roof of the locomotive in the vicinity of a side opening, and said tangential fan is disposed beneath the locomotive roof at the same level as the rheostats; and two parallel tangential fans are driven by a single motor having two shaft ends extending therefrom.

The invention is also applicable to providing ventilation for heat-dissipating electrical apparatus provided within cabinets which are themselves located in the machine compartment of the locomotive. Under these conditions, the invention includes at least one of the following features:

the device includes a cabinet occupying a longitudinally extending middle region of the locomotive and housing electrical apparatus in need of ventilation, the bottom of said housing being connected to at least one opening through an adjacent side region to a side face of the locomotive having an air intake opening therethrough;

for ventilating the rheostats of an electric locomotive or of a combined internal combustion engine and electric locomotive, said rheostats are disposed in a sloping layer beneath the locomotive roof in the proximity of a parllel opening therethrough, and said tangential fan is disposed below and to one side of said rheostats; and the device includes a longitudinally extending cabinet occupying a middle region of the locomotive and housing electrical apparatus in need of ventilation, said cabinet having a bottom opening leading to a bottom containing an electrical transformer provided with radiators for cooling its cooling oil, and being connected via said radiators to floor grilles in side compartments adjacent to the side faces of the locomotive and fitted with the air intake openings.

The present invention makes use of tangential fans, i.e. fans of a type different from axial fans. The term "tangential fan" is widely used, but some authors denote fans of the same type with terms such as transverse fans, diametrical fans, or Mortier fans, after their inventor.

In a ventilating device in accordance with the invention, the rotor of the tangential fan is offset slightly from the vertical plane of symmetry of the area of the items to be ventilated. However its length is substantially identical to the length of the items to be ventilated. The cross-section of the fan blow duct is thus constituted by a relatively long rectangle having a uniform and perfectly laminar distribution of air streamlines therein, unlike the outlet duct from an axial fan which has air flowing along substantially helical streamlines. Unlike an axial fan, where the axes of symmetry of the inlet air flow and of the outlet air flow are the same, the plane of symmetry of the air sucked into a tangential fan is substantially perpendicular to the plane of symmetry of the air blown out therefrom. By placing the items in need of cooling and the ventilation device itself as high as possible within the locomotive, the invention provides two advantages: firstly a maximum volume is left available for housing equipment beneath the ventilation device; and secondly the air intake can be located relatively far up the side of the locomotive, thereby obtaining air with a lower degree of pollution.

The noise reduction obtained by virtue of the invention is due to the fact that it is possible to select a diameter for the fan rotors capable of providing the same flow rate as an axial fan but at a speed of rotation which is three to four times lower, thereby considerably reducing the noise emitted outside the locomotive.

The following description, given by way of example and with reference to the accompanying drawings, relates to devices for ventilating the radiators of a diesel-engined locomotive, for ventilating the starting and braking rheostats of an electric locomotive, and for simultaneously ventilating the fluid radiators and the starting and braking rheostats of a diesel-electric locomotive.

BRIEF DESCRIPTION OF THE DRAWINGS

Embodiments of the invention are described by way of example with reference to the accompanying drawings, in which.

MORE DETAILED DESCRIPTION

Figure 1:
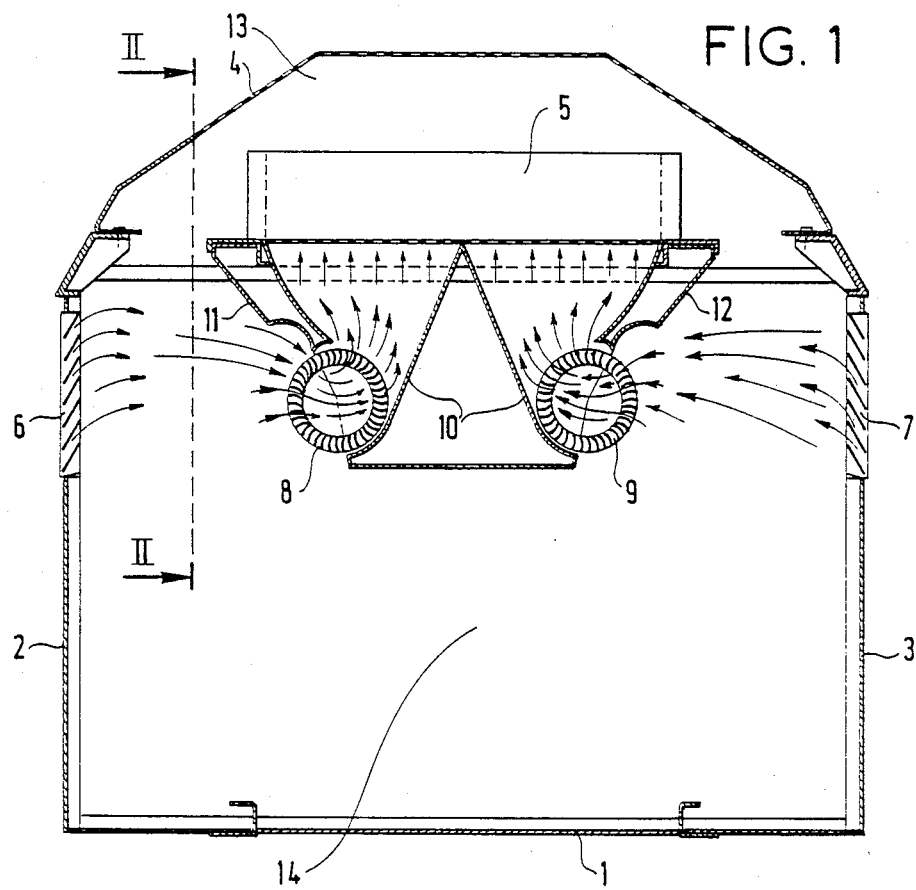
FIG. 1 is a cross-section through a device for ventilating the fluid radiators of a diesel locomotive.
Figure 2:
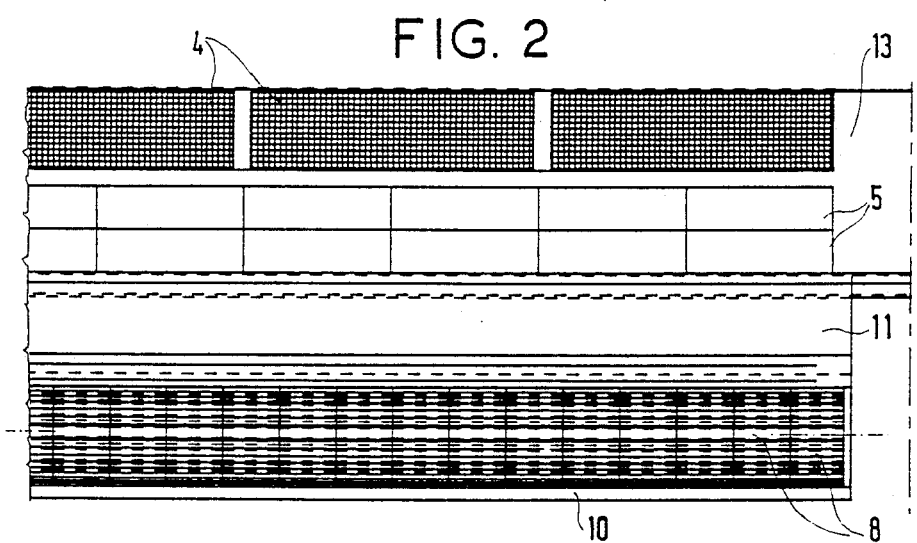
FIG. 2 is an elevation of the FIG. 1 device shown as a section on line II—II of FIG. 1.

In FIGS. 1 and 2, the locomotive comprises a chassis 1, side walls 2 and 3, and a roof 4. Water radiators 5 for cooling its engine, or oil radiators therefor are disposed close under the roof. Air for ventilation is taken in through slatted side windows 6 and 7 leading to tangential fans 8 and 9 which are disposed symmetrically about the plane of symmetry of the locomotive and which rotate in opposite directions for reasons of symmetry.

These fans have their axes horizontal and parallel to the axis of the locomotive, and they are fixed on either side of a triangular-shaped volute 10. Their speed of rotation is adjustable as a function of the required cooling rate. Side baffles 11 and 12 delimit access chambers for the air blown out from the fans towards the radiators 5. The sum of the two outlet cross-sections from the access chambers is equal to the radiator area that requires ventilation. As shown in FIG. 2, the roof of the locomotive is provided with grilles on grids for exhausting the hot air which reaches the volume 13 located above the radiators. The entire volume 14 situated below the fans and their common volute and above the floor of the body work located on the chassis is available for receiving most of the other apparatus and equipment required for locomotive operation. The air taken in through the side windows 6 and 7 follows a substantially horizontal path as shown by the arrows until it reaches the tangential fans 8 and 9 which urge it upwardly along directions indicated by arrows.

After passing through the heat exchange surfaces of the radiators 5, this air is exhausted from the volume 13 via the roof grilles 4.

Figure 3:
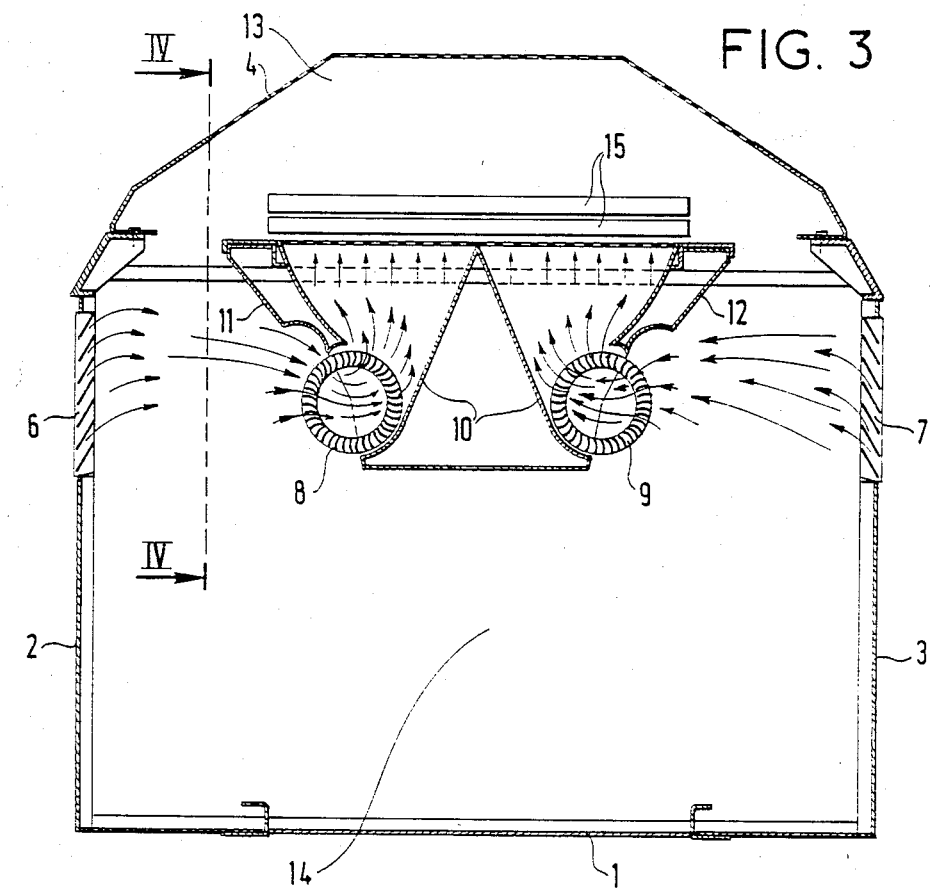
FIG. 3 is a cross-section through a device for ventilating the rheostats of an electric locomotive.
Figure 4:
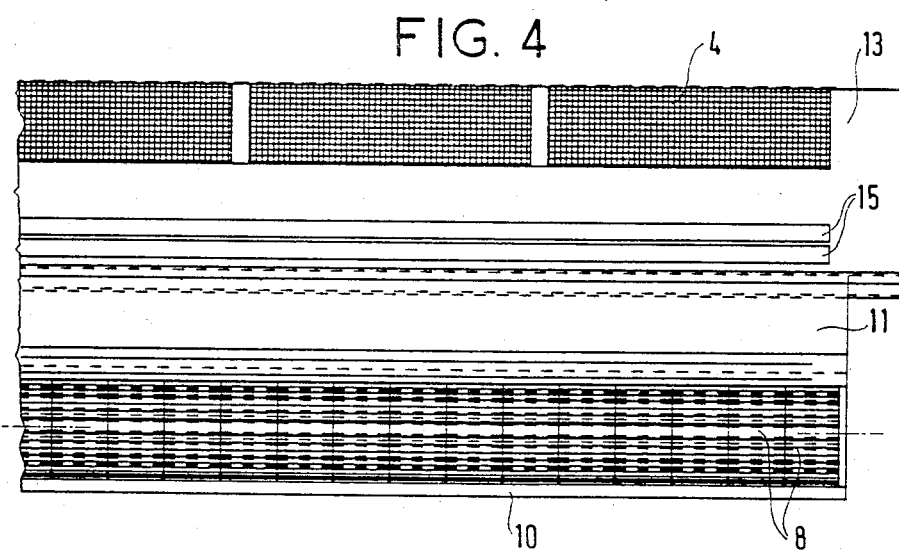
FIG. 4 is an elevation of the FIG. 3 device shown as a section on line IV—IV of FIG. 3.

In the device for an electric locomotive shown in FIGS. 3 and 4, the items are substantially the same as those shown for the device of FIGS. 1 and 2 except that the air flow from the tangential fans 8 and 9 between the volute 10 and the baffles 11 and 12 is used to ventilate the starting and braking rheostats 15.

Figure 5:
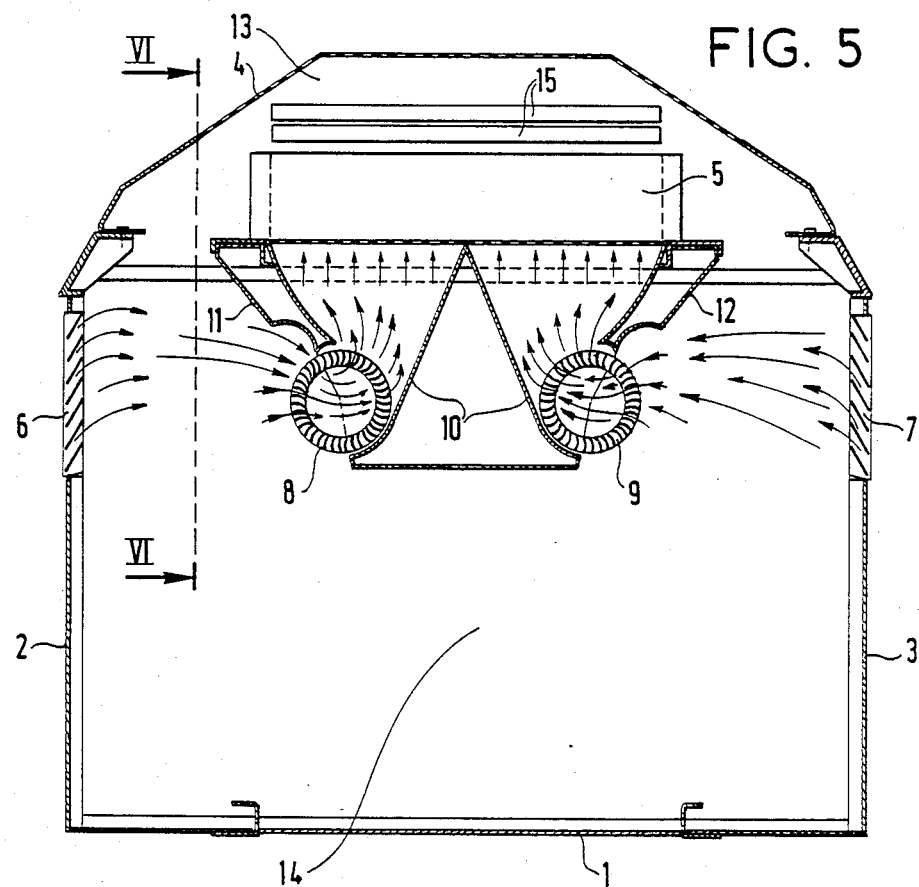
FIG. 5 is a cross-section through a device for ventilating rheostats and fluid radiators in a diesel-electric locomotive.
Figure 6:
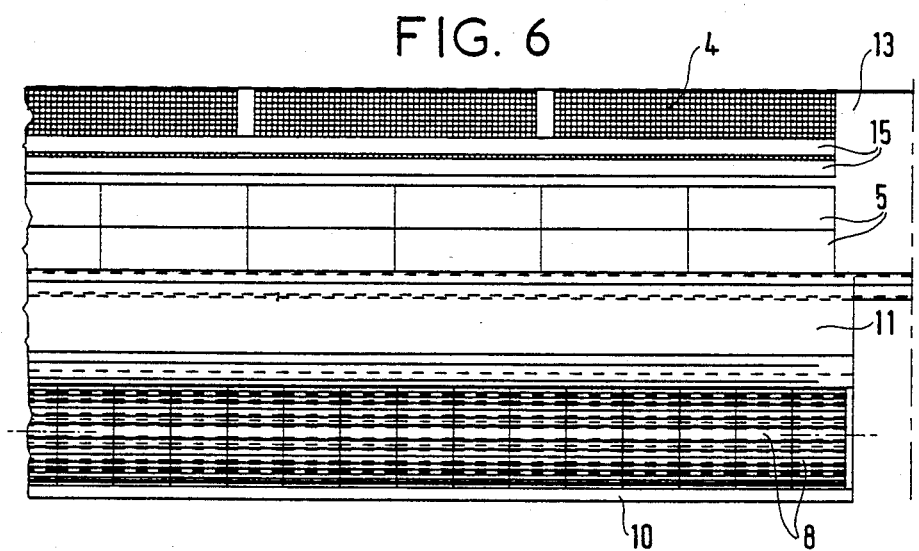
FIG. 6 shows the FIG. 5 device in elevation taken on a section line VI—VI of FIG. 5.

In the device shown in FIGS. 5 and 6 for use with a diesel-electric locomotive, the items shown are substantially the same as those shown in FIGS. 1 and 2, and in FIGS. 3 and 4, however this time the upwardly directed air from the tangential fans 8 and 9 is used to ventilate both the fluid-cooling radiators 5 of the diesel engine and also the starting and braking rheostats 15. These two subassemblies in need of ventilation do not necessarily require the same amount of ventilation at any given moment. The fan speed, and hence the air flow provided thereby, is therefore regulated at any given moment so as to satisfy the requirements of the subassembly most in need of ventilation.

Figure 7:
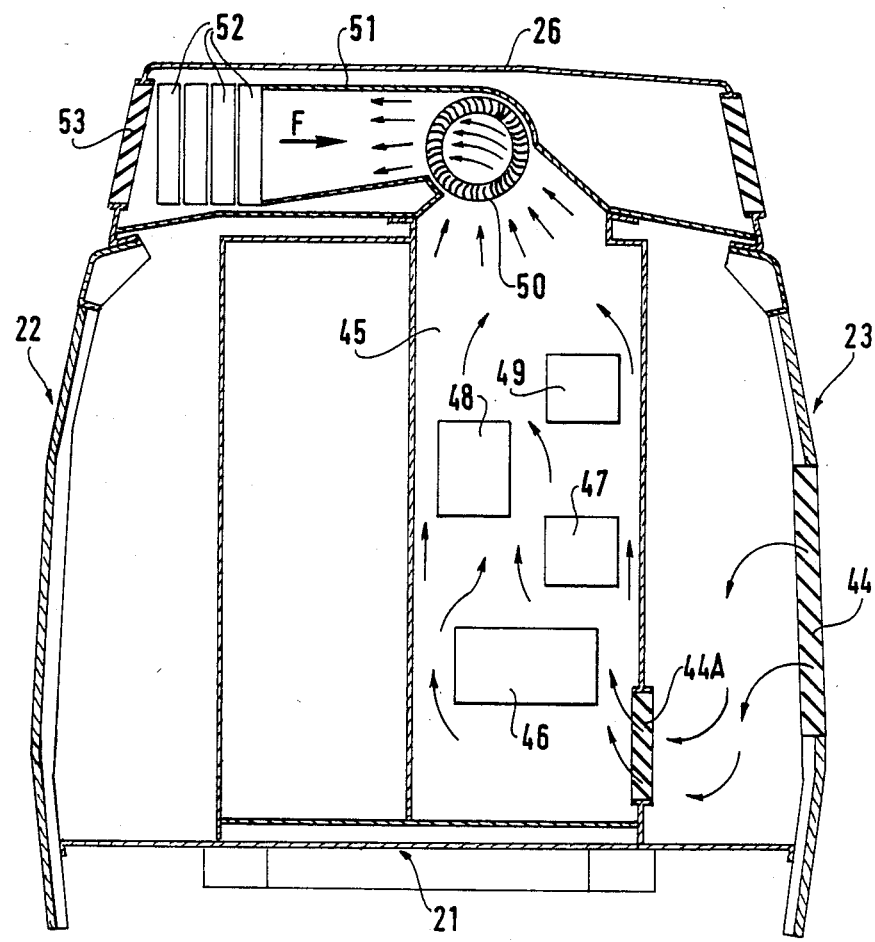
FIG. 7 is a cross-section of a ventilation device for an electric locomotive in a high-speed train including a cabinet containing electric apparatus in need of ventilation.

In FIG. 7, the locomotive bodywork has slatted air intake openings 44 near the bottom of its side face 23. The air taken in therethrough passes through a slatted passage 44A whose slats may be used for adjusting the rate at which air flows into the bottom of a vertical cabinet 45, and then rises (as shown by arrows) through the cabinet to cool various electrical members 46, 47, 48 and 49. On reaching the top of the cabinet, the air encounters tangential fans 50 which blow it out sideways substantially at right angles along a duct 51 having the starting and braking rheostats 52 disposed in successive vertical layers at the end thereof. The air escapes to the outside via openings provided through the side 53 of the locomotive roof.

Figure 8:
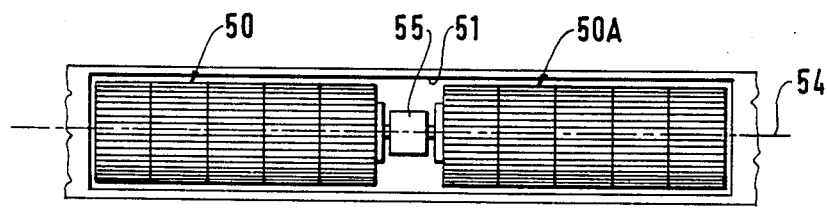
FIG. 8 is an elevation view of two tangential fans driven by a single motor and seen in the direction of arrow F in FIG. 7.

FIG. 8 is an elevation view of the tangential fans 50 and 50A seen in the direction of arrow F of FIG. 7. These fans rotate about a longitudinal horizontal axis 54 which is driven by a single motor 55 having two drive shafts extending therefrom.

Figure 9:
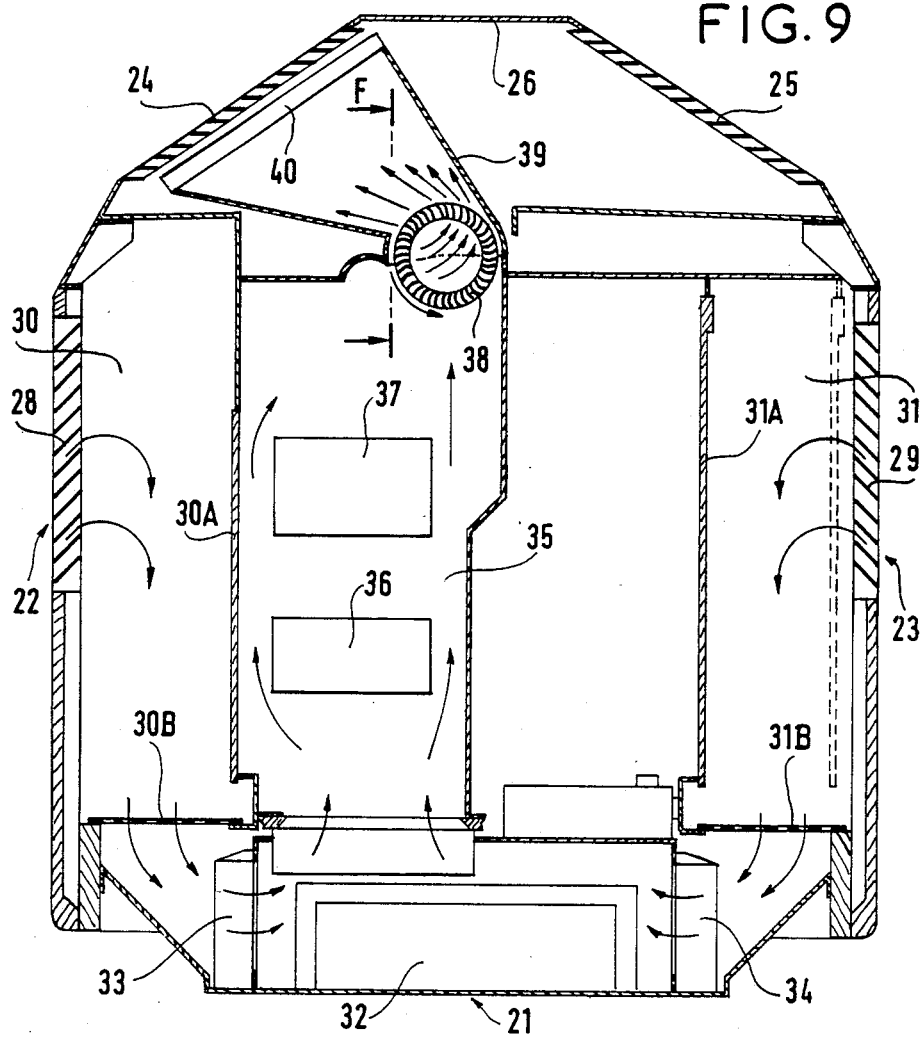
FIG. 9 is a cross-section of a ventilation device for an electric locomotive including both a transformer and a cabinet containing electrical apparatus in need of ventilation.

In FIG. 9, the locomotive bodywork has two side faces 22 and 23, a bottom 21, and a roof 26, said roof having sloping sides 24 and 25. The side faces 22 and 23 are provided with slatted ventilation air inlet openings 27, 28 and 29. These openings open out into two side passages 30 and 31 which are delimited by partitions 30A and 31A with the air flowing downwardly therein, as shown by arrows. A transformer 32 is disposed in the bottom of the locomotive and has heat exchangers 33 and 34 located on either side thereof for cooling its cooling oil.

The flow of ventilating air passes through grilles 30B and 31B constituting the floors of the side passages and then comes into contact with the oil-cooling heat exchangers 33 and 34 prior to rising through a common vertical cabinet 35 housing various electrical members 36, 37, in need of cooling, e.g. condensers for the refrigerators installed to cool the power semiconductors, the inductors, etc . . .

The flow of ventilation air then reaches the tangential fans 38 having longitudinal horizontal axes which serve to blow the air into a duct 39 in the direction shown by arrows towards the starting and braking rheostats 40 which are located in the immediate proximity of the side slope 24 of the locomotive car roof. As seen in FIG. 9, the fans rotate anti-clockwise.

Figure 10:
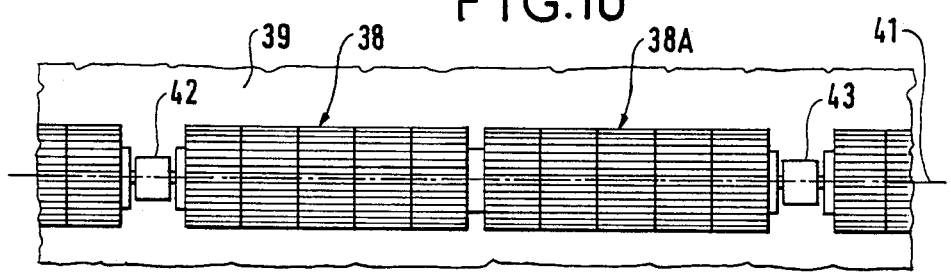
FIG. 10 is a view on a section plane through FIG. 9 showing four tangential fans coupled in pairs to motors having pairs of oppositely-directed shafts.

FIG. 10 is an elevation view seen on section plane F of FIG. 9 showing four tangential fans such as 38 and 38A capable of rotating about the longitudinal axis 41. These fans are coupled in pairs on two two-shaft motors. Each of the motors 42 and 43 drive two fans, one on either side thereof. This disposition becomes necessary when the length of the rheostat grille rectangle becomes too long, or when it is necessary to be able to partially isolate the ventilation.

We claim:

1. A device for ventilating at least one of a fluid radiator unit and a starting and braking rheostat unit in a locomotive having at least one side wall and a roof, which locomotive is powered electrically, by means of an electrical combustion engine, or by a combination thereof, said at least one unit requiring ventilation being disposed below and adjacent the locomotive roof, said device comprising at least one tangential fan having a horizontal axis of rotation placed longitudinally relative to the locomotive and blowing air towards said at least one unit, and at least one air intake opening being placed in a side wall of the locomotive, wherein said at least one unit comprises a rheostat unit having rheostats disposed in successive vertical layers beneath the roof of the locomotive in the vicinity of a second side opening within a side of the locomotive roof through which air is discharged, wherein said tangential fan is disposed beneath the locomotive roof at the same level as the rheostats and means defining a flowpath from said at least one air intake opening leading to said tangential fan and thence through said rheostat unit and discharging through said second side opening.

2. A device according to claim 1, wherein said locomotive includes a cabinet occupying a longitudinally extending middle region of the locomotive and housing electrical apparatus in need of ventilation, and said cabinet having an opening within a side wall of the cabinet at the bottom of said cabinet and communicating with said air intake opening within said side wall of the locomotive.

3. A device according to claim 1, wherein said at least one tangential fan comprises two parallel tangential fans driven by a single motor having two shaft ends extending therefrom and fixedly mounting said tangential fans on opposite sides of said motor.

4. A device for ventilating at least one of a fluid radiator unit and a starting and braking rheostat unit in a locomotive having at least one side wall and a roof, which locomotive is powered electrically, by means of an internal combustion engine, or by a combination thereof, said at least one unit requiring ventilation and being disposed below and adjacent the locomotive roof, said device comprising at least one tangential fan having a horizontal axis of rotation placed longitudinally relative to the locomotive and blowing air towards said at least one unit, and at least one air intake opening being placed in a side wall of the locomotive, wherein said at least one unit comprises a rheostat unit having rheostats disposed in a sloping layer downwardly from the horizontal beneath the locomotive roof, said locomotive roof having an air discharge opening therethrough parallel to and in proximity to said rheostats, and said tangential fan being disposed below and to one side of said rheostats toward a middle region of the locomotive.

5. A device for ventilating at least one of a fluid radiator unit and a starting and braking rheostat unit in a locomotive having at least one side wall and a roof, which locomotive is powered electrically, by means of an internal combustion engine or by a combination thereof, said at least one unit requiring ventilation and being disposed below and adjacent the locomotive roof, said device comprising at lesat one tangential fan having a horizontal axis of rotation placed longitudinally relative to the locomotive and blowing air toward said at least one unit, and at least one air intake opening being placed in a side wall of the locomotive, and wherein a longitudinally extending cabinet occupies a middle region of the locomotive and houses electrical apparatus in need of ventilation, said cabinet having a bottom opening leading to a bottom of the locomotive containing an electrical transformer provided with radiators for cooling its cooling oil, said locomotive further comprising side compartments adjacent to respective side walls of the locomotive, and said locomotive bottom containing said electrical transformer, being connected via said radiators to floor grilles in said side compartments and wherein said at least one air intake opening comprises openings respectively in said locomotive side walls.

* * * * *